United States Patent
Lee et al.

(10) Patent No.: US 9,397,005 B1
(45) Date of Patent: Jul. 19, 2016

(54) DUAL-MATERIAL MANDREL FOR EPITAXIAL CRYSTAL GROWTH ON SILICON

(71) Applicant: International Business Machines Corporation, Armonk, NY (US)

(72) Inventors: Sanghoon Lee, White Plains, NY (US); Effendi Leobandung, Stormville, NY (US); Brent A. Wacaser, Putnam Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/803,253

(22) Filed: Jul. 20, 2015

(51) Int. Cl.
*H01L 21/02* (2006.01)
*H01L 21/8234* (2006.01)
*H01L 21/306* (2006.01)
*H01L 21/308* (2006.01)
*H01L 29/66* (2006.01)
*H01L 21/3105* (2006.01)
*H01L 21/84* (2006.01)
*H01L 27/088* (2006.01)
*H01L 29/267* (2006.01)
*H01L 29/04* (2006.01)

(52) U.S. Cl.
CPC .. *H01L 21/823431* (2013.01); *H01L 21/02381* (2013.01); *H01L 21/02524* (2013.01); *H01L 21/02538* (2013.01); *H01L 21/02551* (2013.01); *H01L 21/3081* (2013.01); *H01L 21/30604* (2013.01); *H01L 21/31051* (2013.01); *H01L 21/845* (2013.01); *H01L 27/0886* (2013.01); *H01L 29/04* (2013.01); *H01L 29/267* (2013.01); *H01L 29/6656* (2013.01)

(58) Field of Classification Search
CPC ............... H01L 21/823432; H01L 21/02381; H01L 21/02524; H01L 21/02538; H01L 21/02551; H01L 21/30604; H01L 21/3081; H01L 21/31051; H01L 21/854; H01L 27/0886; H01L 29/04; H01L 29/267; H01L 29/6656
USPC .................. 257/190, 401, 347, 24, 365, 288; 438/303, 197, 429, 218, 299
See application file for complete search history.

(56) References Cited

U.S. PATENT DOCUMENTS

| | | | |
|---|---|---|---|
| 7,268,058 B2 * | 9/2007 | Chau | H01L 29/785 257/E21.442 |
| 8,768,271 B1 * | 7/2014 | Then | H01L 29/802 257/368 |
| 8,946,829 B2 * | 2/2015 | Wann | H01L 21/823821 257/288 |
| 8,954,021 B2 | 2/2015 | Then et al. | |

(Continued)

FOREIGN PATENT DOCUMENTS

KR  10-2012-0020062  3/2012
WO     2014099001 A1  6/2014

*Primary Examiner* — Mohammed Shamsuzzaman
(74) *Attorney, Agent, or Firm* — Louis Percello

(57) ABSTRACT

In one example, a method for fabricating a semiconductor device includes etching a layer of silicon to form a plurality of fins and growing layers of a semiconductor material directly on sidewalls of the plurality of fins, wherein the semiconductor material and surfaces of the sidewalls have different crystalline properties.

14 Claims, 5 Drawing Sheets

(56) References Cited

U.S. PATENT DOCUMENTS

| | | | |
|---|---|---|---|
| 2007/0004117 A1* | 1/2007 | Yagishita | H01L 21/845 438/197 |
| 2010/0163926 A1* | 7/2010 | Hudait | H01L 29/1054 257/190 |
| 2011/0133166 A1* | 6/2011 | Bangsaruntip | B82Y 10/00 257/24 |
| 2011/0147842 A1* | 6/2011 | Cappellani | H01L 21/26506 257/365 |
| 2011/0156004 A1* | 6/2011 | Radosavljevic | B82Y 10/00 257/24 |
| 2012/0015493 A1* | 1/2012 | Lin | H01L 29/66795 438/303 |
| 2013/0244392 A1* | 9/2013 | Oh | H01L 29/66477 438/299 |
| 2014/0070316 A1* | 3/2014 | Chan | H01L 21/823412 257/347 |
| 2014/0170998 A1* | 6/2014 | Then | H01L 29/802 455/127.2 |
| 2015/0061014 A1* | 3/2015 | Jacob | H01L 21/764 257/347 |
| 2015/0069465 A1* | 3/2015 | Cheng | H01L 29/1054 257/190 |
| 2015/0084101 A1* | 3/2015 | Adam | H01L 29/6681 257/288 |
| 2015/0108572 A1* | 4/2015 | Cheng | H01L 27/1211 257/347 |
| 2015/0144999 A1* | 5/2015 | Ching | H01L 29/66795 257/190 |
| 2015/0228789 A1* | 8/2015 | Basker | H01L 29/7848 257/401 |
| 2015/0255570 A1* | 9/2015 | Basu | H01L 29/6681 257/352 |
| 2015/0279696 A1* | 10/2015 | Cohen | H01L 21/3247 257/76 |
| 2016/0049338 A1* | 2/2016 | Ching | H01L 29/0607 438/218 |
| 2016/0064288 A1* | 3/2016 | Cheng | H01L 29/165 257/192 |

* cited by examiner

DUAL-MATERIAL MANDREL FOR EPITAXIAL CRYSTAL GROWTH ON SILICON

FIELD OF THE DISCLOSURE

The present disclosure relates generally to semiconductor devices and relates more specifically to multiple gate field effect transistors.

BACKGROUND OF THE DISCLOSURE

Multiple gate field effect transistors (FETs) are metal-oxide-semiconductor field effect transistors (MOSFETs) that incorporate more than one gate into a single device. A finFET is a specific type of multiple gate FET in which the conducting channel is wrapped by a thin fin forming the body of the device. The effective channel length of the device in this case is determined by the thickness of the fin (measured from source to drain). The wrap-around structure of the gate provides improved electrical control over the channel, and thus helps mitigate leakage current and other short-channel effects.

SUMMARY OF THE DISCLOSURE

In one example, a method for fabricating a semiconductor device includes etching a layer of silicon to form a plurality of fins and growing layers of a semiconductor material directly on sidewalls of the plurality of fins, wherein the semiconductor material and surfaces of the sidewalls have different crystalline properties.

In another example, a method for fabricating a semiconductor device includes depositing a buried oxide layer directly upon a substrate, depositing a silicon-on-insulator layer directly upon the buried oxide layer, and depositing a hard mask directly upon the silicon-on-insulator layer, where the hard mask comprises a first material layer deposited directly upon the silicon-on-insulator layer and a second material layer deposited directly upon the first material layer, and where the first material layer and the second material layer are formed from different materials. The hard mask is patterned to create a plurality of fins, and the silicon-on-insulator layer is etched in a manner that removes portions of the silicon-on-insulator layer not residing directly beneath the plurality of fins. A plurality of spacers is formed along exposed surfaces of the silicon-on-insulator layer, and a surface oxide is deposited over the plurality of spacers, where surface oxide fills in spaces between the plurality of fins. The second material layer of the hard mask and the plurality of spacers are removed in a manner that is selective to the first material layer of the hard mask and to the silicon on insulator layer, and the removal exposes sidewalls of the silicon-on-insulator layer. A semiconductor material is grown directly on the sidewalls of the silicon-on-insulator layer, where the semiconductor material is a different material from the material of the silicon-on-insulator layer. The surface oxide, the first material layer of the hard mask, and the silicon-on-insulator layer are removed in a manner that is selective to the semiconductor material.

In another example, a semiconductor device includes a plurality of fins comprising silicon. A layer of a semiconductor material is grown directly on a sidewall of at least one fin of the fins. The semiconductor material and the surface of fin have different crystalline properties.

BRIEF DESCRIPTION OF THE DRAWINGS

The teachings of the present disclosure can be readily understood by considering the following detailed description in conjunction with the accompanying drawings, in which.

To facilitate understanding, identical reference numerals have been used, where possible, to designate identical elements that are common to the Figures.

DETAILED DESCRIPTION

In one example, a dual-material mandrel for epitaxial crystal growth on silicon is disclosed. Semiconductor materials such as Groups III-V materials have been used to form transistors including finFET devices. These materials are typically difficult to obtain in bulk crystal form, and often must be grown on substrates. However, the differences in the crystalline properties of the semiconductor film and the substrate surface (e.g., different lattice constants) complicate growth of the semiconductor materials. Thick buffers deposited between the substrate surface and the semiconductor materials can facilitate growth; however, they also take up space on a device whose dimensions are already very limited without improving device operation.

Examples of the present disclosure provide a dual-material mandrel for epitaxial crystal growth on silicon that eliminates the need for a thick buffer at the substrate/semiconductor device interface. In one example, a hard mask comprising two material layers formed from different materials (e.g., an oxide and a nitride) is used to pattern a layer of crystalline silicon. A first of the material layers is removed to create trenches in which a semiconductor material, such as a Group III/V, Group II/IV, or Group IV semiconductor material can be grown directly onto the sidewalls of the patterned silicon, without the need for a buffer in between the silicon and the semiconductor material. The second of the material layers constrains the growth of the semiconductor material to the silicon sidewalls and is removed after the semiconductor material has been grown.

FIGS. 1A-1H illustrate a semiconductor device 100 during various stages of a first fabrication process performed according to examples of the present disclosure. As such, when viewed in sequence, 1A-1H also serve as a flow diagram for the first fabrication process. In particular, FIGS. 1A-1H illustrate cross sectional views of the semiconductor device 100 during the various stages of the first fabrication process.

Figure 1A:
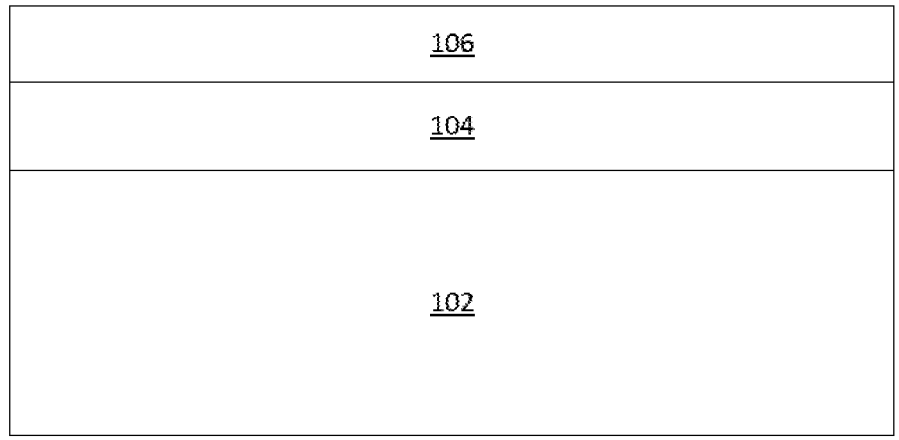
FIGS. 1A-1H illustrate a semiconductor device during various stages of a first fabrication process performed according to examples of the present disclosure.

Referring to FIG. 1A, one example of the semiconductor device 100 begins as a wafer or substrate 102, formed, for example, from bulk silicon (Si), a Group III-V material, a Group III-V material on silicon, or other semiconductor materials. In one example, the crystal orientation of the top surface of the substrate 102 (i.e., the surface upon which the rest of the structure of the semiconductor device 100 is built) is defined by a Miller index of (100) or (110). A buried oxide layer 104, formed, for example, by bonding or high energy oxygen implantation, is bonded directly on the wafer 102. A silicon-on-insulator (SOI) layer 106 is bonded directly on the buried oxide layer 104. In one example, the silicon of the SOI layer 106 has a crystalline orientation. In one example, the crystal orientation of the top surface of the SOI layer 106 is defined by a Miller index that is different from the Miller index defining the crystal orientation of the top surface of the substrate 102. For instance, if the crystal orientation of the top surface of the substrate 102 is defined by a Miller index of (100), the crystal orientation of the top surface of the SOI layer 106 may be defined by a Miller index of (110).

Figure 1B:
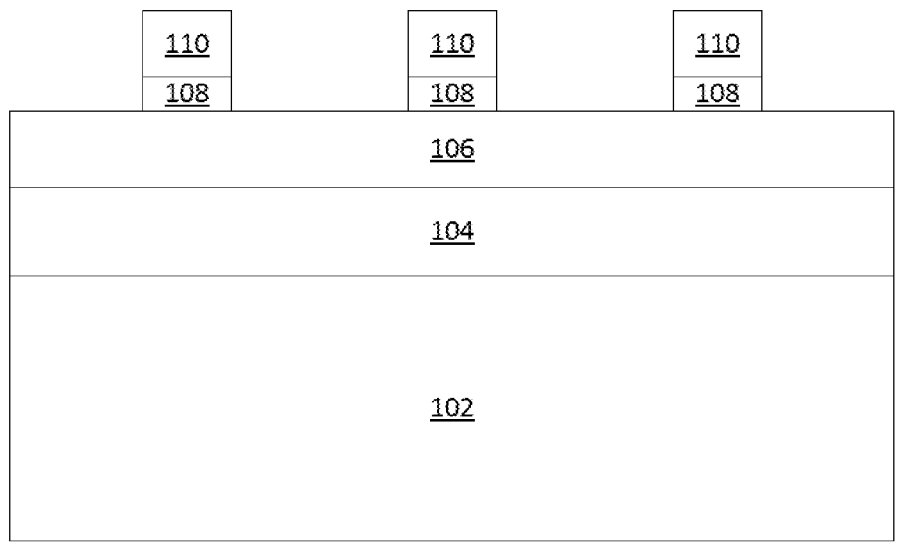

As illustrated in FIG. 1B, a mandrel or hard mask is next deposited directly on the SOI layer 106. The hard mask comprises a first material layer 108 and a second material layer 110 formed from two different materials. For instance, the first material layer 108 may be formed from an oxide, while the second material layer 110 may be formed from a nitride. Next, the first material layer 108 and the second material layer 110 of the hard mask are patterned to create a plurality of "fins." Any number of fins may be created as a result of this patterning process, and the spacing between the individual fins is variable. Patterning of the first material layer 108 and the second material layer 110 involves etching the first material layer 108 and the second material layer 110 down to the SOI layer 106, and may further involve the deposition of additional layers of material, such as additional masks or other sacrificial materials (not shown), that are removed in the process of creating the structure illustrated in FIG. 1B. In one example, the patterning of the first material layer 108 and the second material layer 110 results in fins whose sidewalls are aligned to the crystal plane of the SOI layer 106 that is defined by a Miler index of (111), although other crystal orientations are also possible.

Figure 1C:
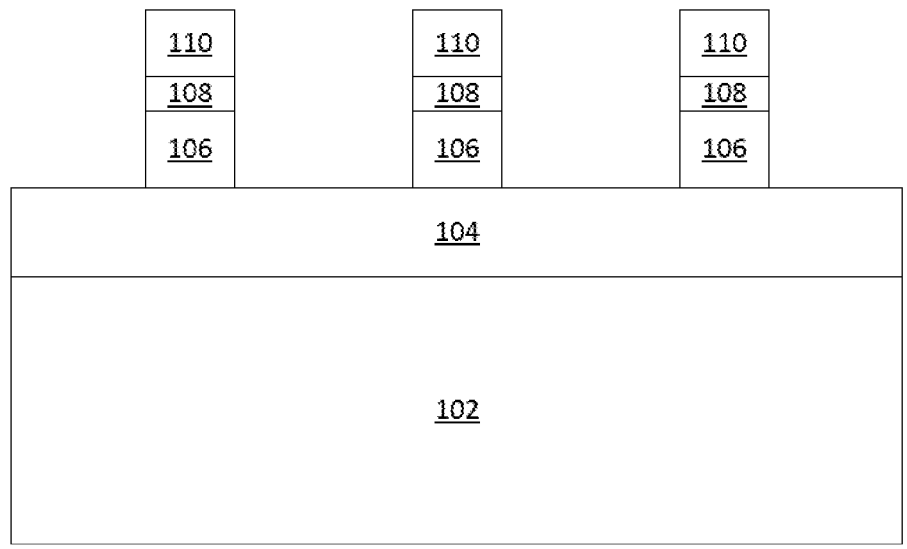

As illustrated in FIG. 1C, the SOI layer 106 is next etched down to the buried oxide layer 104. In one example, the etching of the SOI layer 106 is a wet etch or reactive ion etch (RIE) process. As illustrated, the portions of the SOI layer 106 that reside below the hard mask remain after the etching, and form the lower portions of the "fins" that were created by the patterning of the hard mask in FIG. 1B. In one example, the etching of the SOI layer 106 cuts into the silicon of the SOI such that the exposed surface of the SOI layer 106 is aligned in a crystal orientation that is defined by a Miler index of (111).

Figure 1D:
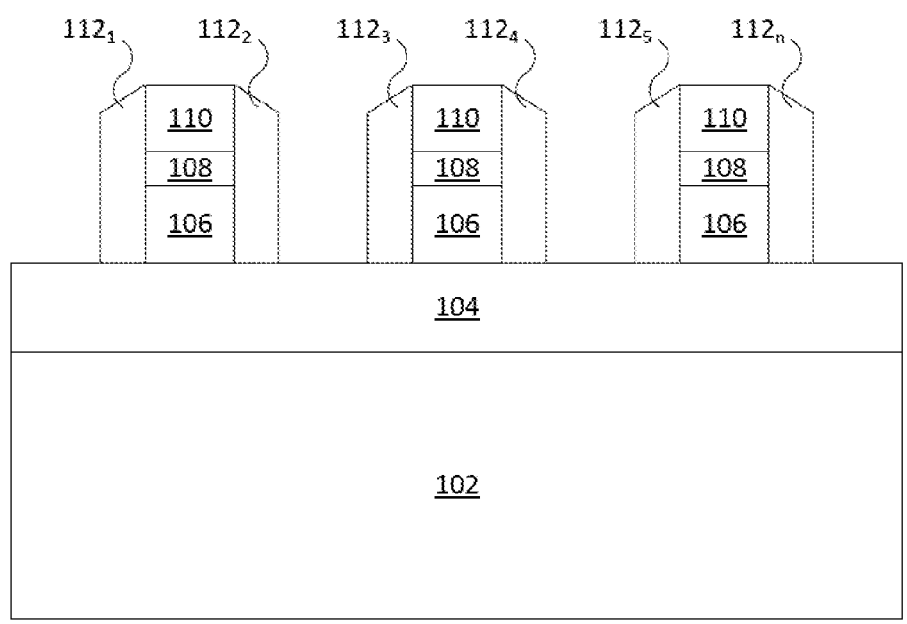

As illustrated in FIG. 1D, a plurality of spacers $112_1$-$112_n$ (hereinafter collectively referred to as "spacers 112") is next formed along the sidewalls of the fins. The spacers 112 thus contact the SOI layer 106 and the first material layer 108 and the second material layer 110 of the hard mask. In one example, the spacers 112 are formed from the same material as the second material layer 110 of the hard mask, e.g., from a nitride.

Figure 1E:
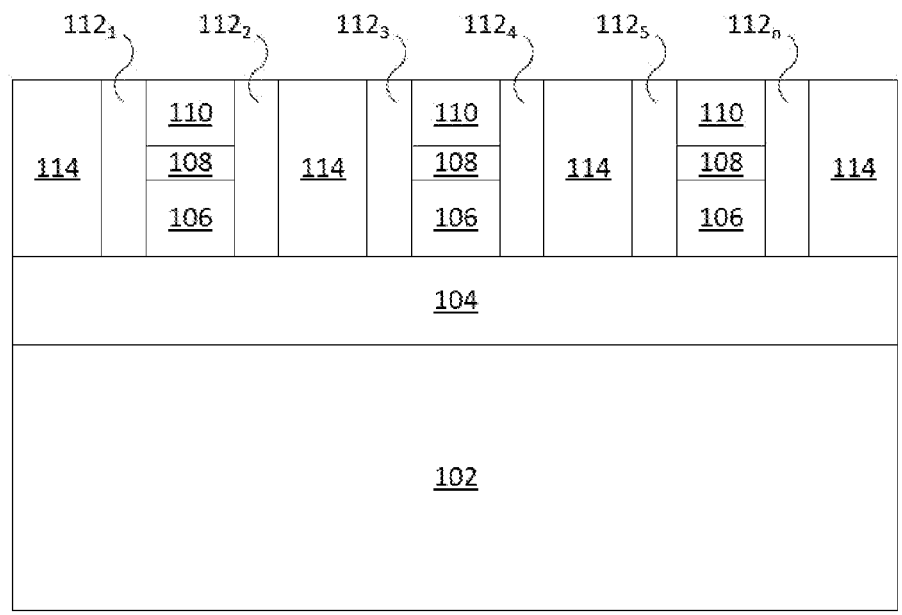

As illustrated in FIG. 1E, a surface oxide layer 114 is next deposited over the semiconductor device 100. The surface oxide layer 114 directly contacts the second material layer 110 of the hard mask, the spacers 112, and the buried oxide layer 104 and fills in the spaces between the fins. The surface oxide layer 114 is then planarized. As illustrated, planarization of the surface oxide layer 114 may additionally result in the planarization of portions of the spacers 112 and the second material layer 110 of the hard mask.

Figure 1F:
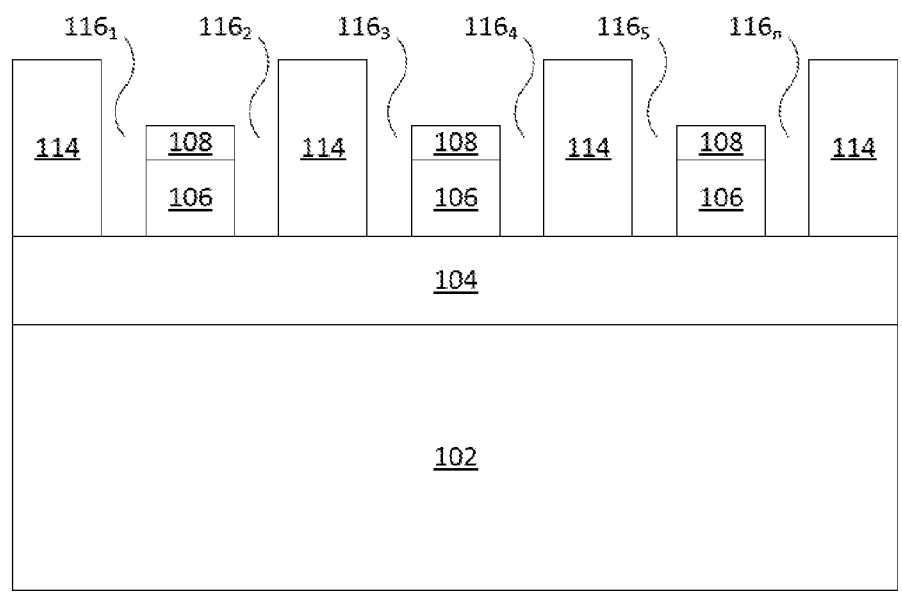

As illustrated in FIG. 1F, the second material layer 110 of the hard mask and the spacers 112 are next removed. In one example, removal of the second material layer 110 of the hard mask and the spacers 112 is performed using an etch process that is selective to (i.e., does not remove) the portions of the buried oxide layer 104, surface oxide layer 114, and the SOI layer 106 residing beneath the second material layer 110 of the hard mask and the spacers 112. Thus, the removal of the second material layer 110 of the hard mask and the spacers 112 results in a plurality of trenches $116_1$-$116_n$ (hereinafter collectively referred to as "trenches 116") being formed around the fins, in the areas where the spacers 112 used to be. This exposes the sidewalls of the fins (i.e., the sidewalls of the SOI layer 106 and the first material layer 108 of the hard mask).

Figure 1G:
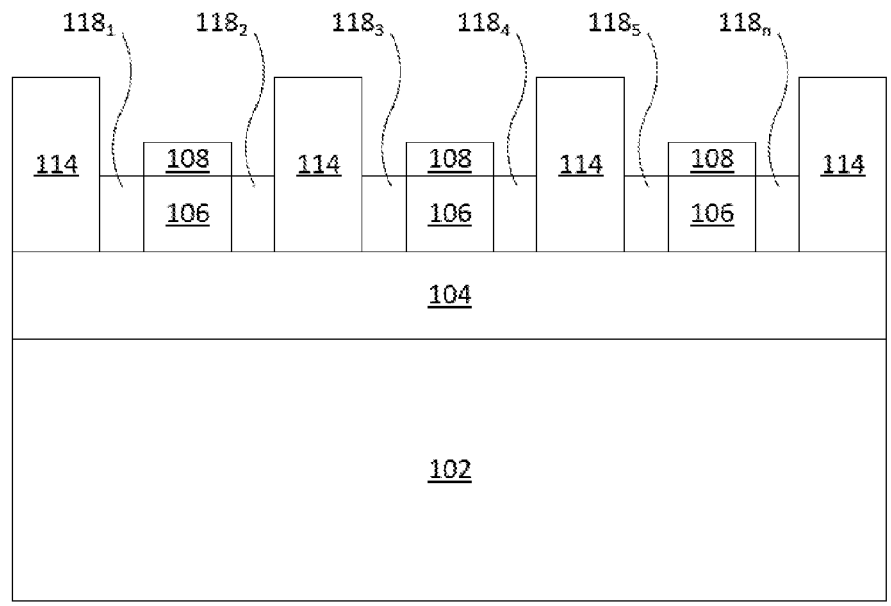

As illustrated in FIG. 1G, semiconductor channels $118_1$-$118_n$ (hereinafter collectively referred to as "semiconductor channels 118") are next grown epitaxially directly on the sidewalls of the fins, i.e., in the trenches 116. In one example, growth of the semiconductor channels 118 is limited to the sidewalls of the SOI layer 106; thus, the semiconductor channels 118 directly contact the buried oxide layer 104 and the SOI layer 106 and do not extend to the first material layer 108 of the hard mask. The semiconductor channels 118 are formed from a semiconductor material having different properties from the sidewall surfaces of the SOI layer 106 (e.g., different lattice constants) but the same crystal orientation. In one example, the semiconductor channels 118 are formed from a Group III/V, Group II/IV, or Group IV semiconductor, such as indium gallium arsenide (InGaAs).

Figure 1H:
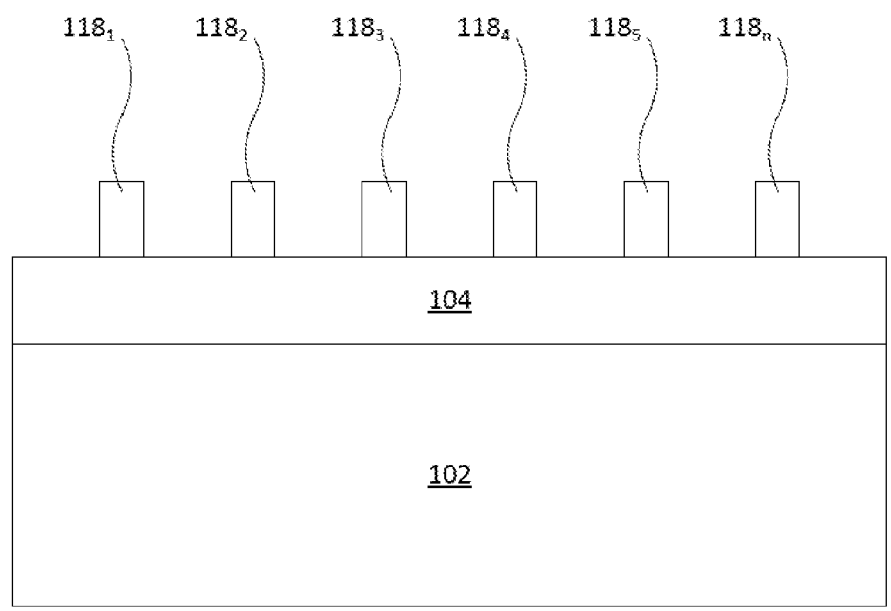

As illustrated in FIG. 1H, the surface oxide layer 114, the first material layer 108 of the hard mask, and the SOI 106 are next removed. In one example, the surface oxide layer 114, the second material layer 108 of the hard mask, and the SOI 106 are removed using an etch process, such as a xenon fluoride gas etch or a tetramethylammonium hydroxide wet anisotropic etch. As illustrated, the etching is selective to (i.e., does not remove) the epitaxially grown semiconductor channels 118.

The resultant semiconductor channels 118 may form the conducting channels of a finFET device. The finFet device may be an N-type device (NFET) or a P-type device (PFET). Thus, Groups III-V semiconductor channels may be grown directly on a silicon surface having a different crystalline structure, without the use of a thick buffer. Thus, device space is not wasted on buffers that provide no operational advantage. In the case of a PFET, a narrower version of the SOI layer 106 can be used as is to form the dual material fins.

Thus, the disclosed dual-material mandrel or hard mask eliminates the need for a thick buffer at the substrate/semiconductor device interface during fabrication of the semiconductor device 100. The only template needed to grow the semiconductor channels 118 is the SOI layer 106, which is small and thin relative to the typical buffer (which can be several μm thick and wide).

Figure 2:
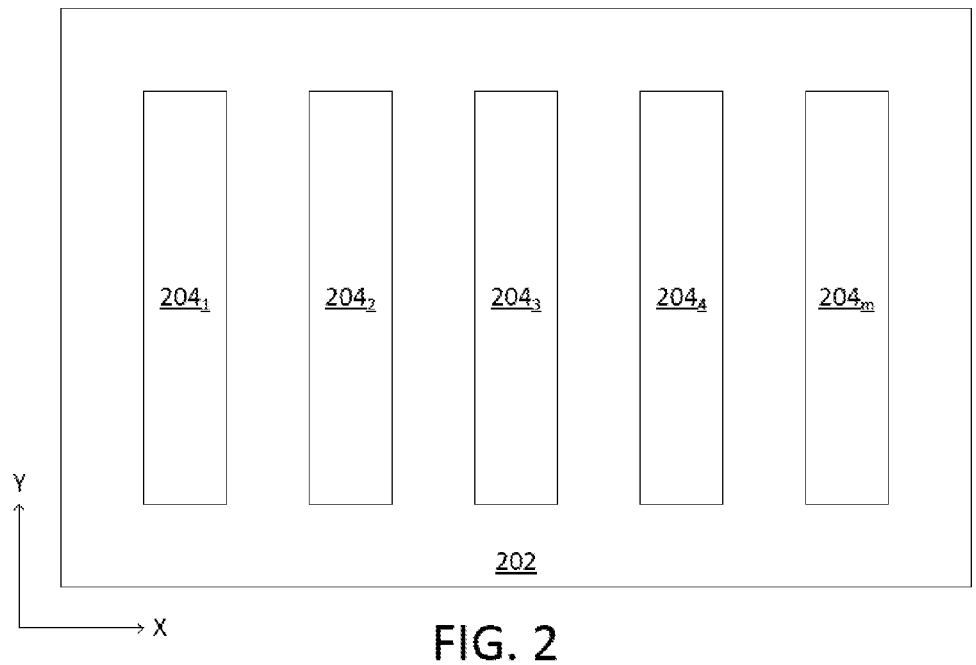
FIG. 2 illustrates a top view of a first example of a semiconductor device fabricated according to the process illustrated in FIGS. 1A-1H.

The process illustrated in FIGS. 1A-1H may be used to fabricate semiconductor channels in a plurality of different patterns upon the buried oxide layer, including one- and two-dimensional patterns. FIG. 2, for example, illustrates a top view of a first example of a semiconductor device 200 fabricated according to the process illustrated in FIGS. 1A-1H. In particular, FIG. 2 illustrates a semiconductor device 200 in which the semiconductor channels have been fabricated into a one-dimensional pattern. The buried oxide layer 202 is visible from the top, as are the semiconductor channels $204_1$-$204_m$ (hereinafter collectively referred to as "semiconductor channels 204"), which are arranged in a set of parallel continuous lines. The arrangement illustrated in FIG. 2 is obtained by performing the process illustrated in FIGS. 1A-1H along only one of the x and y dimensions of the substrate.

Figure 3:
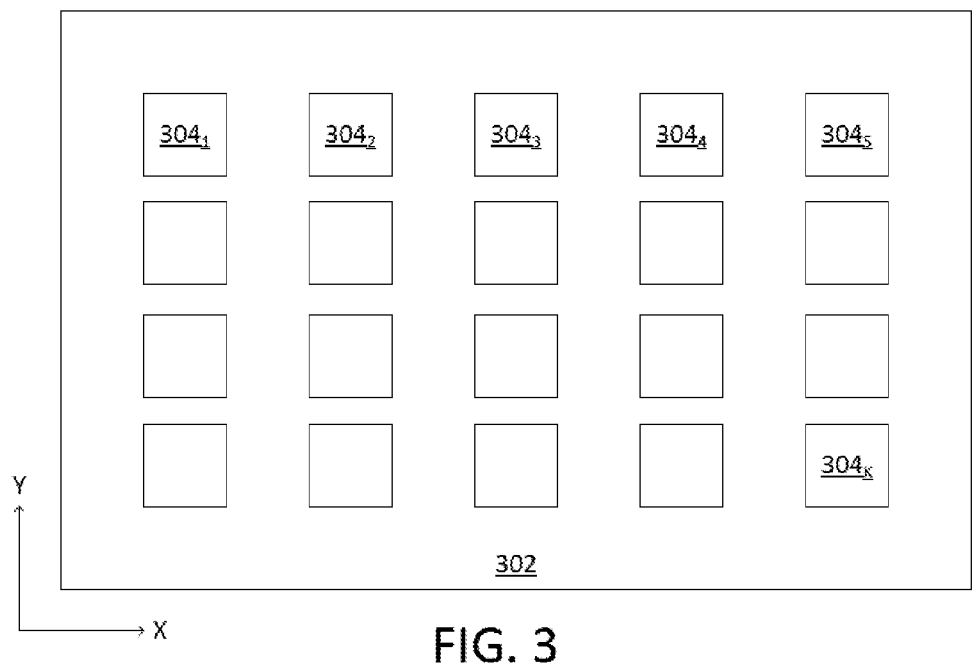
FIG. 3 illustrates a top view of a first example of a semiconductor device fabricated according to the process illustrated in FIGS. 1A-1H.

FIG. 3 illustrates a top view of a first example of a semiconductor device 300 fabricated according to the process illustrated in FIGS. 1A-1H. In particular, FIG. 3 illustrates a semiconductor device 300 in which the semiconductor channels have been fabricated into a two-dimensional pattern. The buried oxide layer 302 is visible from the top, as are the semiconductor channels $304_1$-$304_k$ (hereinafter collectively referred to as "semiconductor channels 304"), which are arranged in a rectangular matrix. The arrangement illustrated in FIG. 3 is obtained by performing the process illustrated in FIGS. 1A-1H along both of the x and y dimensions of the substrate.

Although various embodiments which incorporate the teachings of the present invention have been shown and described in detail herein, those skilled in the art can readily devise many other varied embodiments that still incorporate these teachings.

What is claimed is:

1. A method for fabricating a semiconductor device, the method comprising:
   depositing a buried oxide layer directly upon a substrate;
   depositing a silicon-on-insulator layer directly upon the buried oxide layer;
   depositing a hard mask directly upon the silicon-on-insulator layer, wherein the hard mask comprises a first material layer deposited directly upon the silicon-on-insulator layer and a second material layer deposited directly upon the first material layer, and wherein the first material layer and the second material layer are formed from different materials;
   patterning the hard mask to create a plurality of fins;
   etching the silicon-on-insulator layer in a manner that removes portions of the silicon-on-insulator layer not residing directly beneath the plurality of fins;
   forming a plurality of spacers along exposed surfaces of the silicon-on-insulator layer;
   depositing a surface oxide over the plurality of spacers, wherein surface oxide fills in spaces between the plurality of fins;
   removing the second material layer of the hard mask and the plurality of spacers in a manner that is selective to the first material layer of the hard mask and to the silicon on insulator layer, wherein the removing exposes sidewalls of the silicon-on-insulator layer;
   growing a semiconductor material directly on the sidewalls of the silicon-on-insulator layer, wherein the semiconductor material is a different material from the material of the silicon-on-insulator layer; and
   removing the surface oxide, the first material layer of the hard mask, and the silicon-on-insulator layer in a manner that is selective to the semiconductor material.

2. The method of claim 1, wherein the semiconductor material is a Group III/V material, a Group II/VI material, or a Group IV material.

3. The method of claim 1, wherein the semiconductor material and the material of the silicon-on-insulator layer have different crystalline properties.

4. The method of claim 3, wherein the different crystalline properties include different lattice constants.

5. The method of claim 1, wherein the first material layer comprises an oxide.

6. The method of claim 1, wherein the second material layer comprises a nitride.

7. The method of claim 1, wherein the plurality of spacers is formed from a same material as the second material layer of the hard mask.

8. The method of claim 1, wherein the first material layer limits growth of the semiconductor material to the sidewalls.

9. The method of claim 1, wherein the growing is limited to the sidewalls of the fins only by the hard mask layer that is directly in contact with the plurality of fins.

10. The method of claim 1, wherein the semiconductor device is a field effect transistor.

11. The method of claim 10, wherein the field effect transistor is a multiple gate device.

12. The method of claim 1, wherein the semiconductor material is a Group III/V material.

13. The method of claim 1, wherein the semiconductor material is a Group II/VI material.

14. The method of claim 1, wherein the semiconductor material is a Group IV material.

* * * * *